(12) United States Patent
Bowles et al.

(10) Patent No.: US 9,090,454 B2
(45) Date of Patent: Jul. 28, 2015

(54) SEQUENTIAL WAFER BONDING

(71) Applicants: Philip H. Bowles, Gilbert, AZ (US);
Stephen R. Hooper, Mesa, AZ (US)

(72) Inventors: Philip H. Bowles, Gilbert, AZ (US);
Stephen R. Hooper, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 65 days.

(21) Appl. No.: 14/011,289

(22) Filed: Aug. 27, 2013

(65) Prior Publication Data

US 2015/0061044 A1 Mar. 5, 2015

(51) Int. Cl.

| | | |
|---|---|---|
| *H01L 21/00* | (2006.01) | |
| *B81B 7/00* | (2006.01) | |
| *B81C 1/00* | (2006.01) | |
| *H01L 29/66* | (2006.01) | |
| *H01L 23/10* | (2006.01) | |
| *H01L 29/84* | (2006.01) | |

(52) U.S. Cl.
CPC ............. *B81B 7/0029* (2013.01); *B81C 1/0023* (2013.01); *H01L 23/10* (2013.01); *H01L 29/66007* (2013.01); *H01L 29/84* (2013.01)

(58) Field of Classification Search
CPC .... H01L 23/10; H01L 29/66007; H01L 29/84
USPC ............. 257/415, E23.193, E21.705; 438/50, 438/51, 455, 456, 458; 73/754
See application file for complete search history.

(56) References Cited

U.S. PATENT DOCUMENTS

| | | |
|---|---|---|
| 8,035,209 B2 | 10/2011 | Gonska et al. |
| 8,250,921 B2 | 8/2012 | Nasiri et al. |
| 2002/0063326 A1* | 5/2002 | Nakashima ..................... 257/704 |
| 2009/0294974 A1* | 12/2009 | Leung et al. .................. 257/772 |
| 2012/0212925 A1 | 8/2012 | Zoellin et al. |

FOREIGN PATENT DOCUMENTS

CN 101643193 2/2010

* cited by examiner

*Primary Examiner* — Robert Huber
(74) *Attorney, Agent, or Firm* — Lempia Summerfield Katz LLC

(57) ABSTRACT

Embodiments of methods of fabricating a sensor device includes attaching a first wafer to a sensor wafer with a first bond material, and attaching a second wafer to the sensor wafer with a second bond material, the second bond material having a lower bonding temperature than the first bond material. After attaching the second wafer, an opening (e.g., a trench cut) through the second wafer is formed, and an adhesive material is provided through the opening to further secure the second wafer to the sensor wafer. Embodiments of sensor devices formed using such methods include a first device cavity having a first pressure, and a second device cavity having a second pressure.

15 Claims, 4 Drawing Sheets

SEQUENTIAL WAFER BONDING

FIELD OF INVENTION

The present embodiments relate to semiconductor devices, microelectromechanical system (MEMS) sensor devices, and method of their fabrication.

BACKGROUND

Microelectromechanical system (MEMS) sensor devices often present packaging challenges. For instance, MEMS sensors are typically sealed to perform properly over time. The sealing provides protection from corrosive elements and other harsh operating environments, such as, for example, those presented in an automotive application. The sealing also helps ensure relatively high reliability over the lifetime of the device. For example, with some types of MEMS accelerometers, it is desirable to seal the MEMS accelerometer in a chamber to prevent contamination of the moving parts of the MEMS accelerometer during subsequent processes. In another example, micro-gyroscopes are packaged in a hermetically sealed cavity or enclosure to operate at a known pressure level, typically a pressure level near vacuum pressure level. Additional packaging challenges arise when the sealed cavity for the MEMS sensor is assembled with an integrated circuit, such as an application-specific integrated circuit (ASIC), designed to control and communicate with the MEMS sensor.

Combining different types of MEMS sensors together on a single die can present further challenges. One common combination involves MEMS accelerometers and MEMS gyroscopes. MEMS accelerometer performance improves with damping from gas in the cavity. The operating environment of a MEMS accelerometer is accordingly at a much higher pressure level, e.g., near atmospheric pressure, than the near vacuum levels for the MEMS gyroscope. So using a common pressure for the accelerometer and gyroscope devices thus presents performance and/or design tradeoffs. The alternative, providing dual pressures in a single die, presents a considerable technical challenge.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
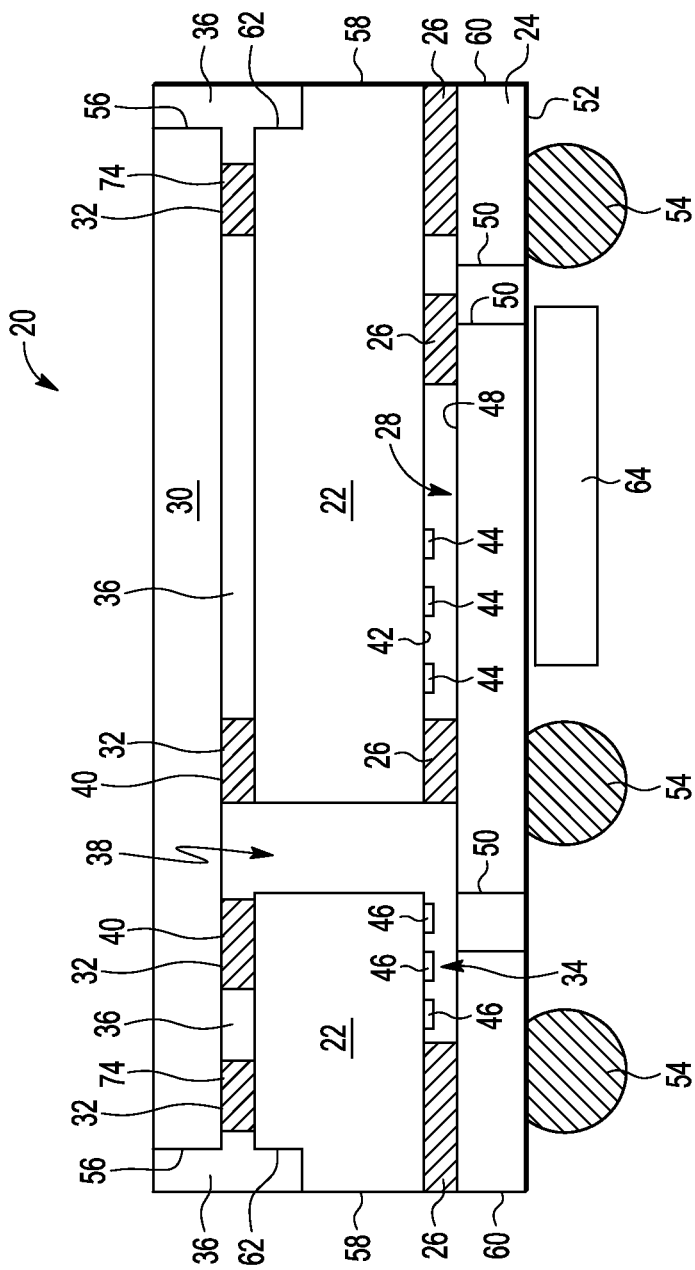
FIG. 1 is a schematic, simplified, cross-sectional view of a sensor device having multiple sensor cavities in accordance with one embodiment.

Sensor device fabrication methods having sequentially bonded wafers are described. Sensor devices fabricated in accordance with the fabrication methods are also described. The fabrication methods securely attach sequentially bonded wafers, such as cap wafers, to a sensor wafer. The technique fixes the positions of the sequentially bonded wafers relative to the sensor wafer despite subsequent processing that may expose the wafers (or die thereof) to heat sufficient for solder reflow and, thus, wafer slippage.

The attachment techniques of the disclosed embodiments may address the challenge presented by sequential wafer bonding. With respect to each wafer bond, the temperature reached to achieve bonding cannot be subsequently reached during fabrication or customer deployment, as parts may shift relative to one another. One example involves bonding a third wafer to a pair of bonded wafers. The wafer pair is bonded using a first bond material (e.g., AlGe), which may remelt if reheated to its bonding temperature (i.e., the temperature at which the bond material melts or reflows). To avoid that, another bond material, such as a Pb-free packaging solder (e.g., SnAgCu), with a lower bonding temperature may then be used to secure the third wafer. But the same problem is now present for the packaging solder, which will also remelt if its bonding or reflow temperature is subsequently reached. Unfortunately, the reflow temperature may be reached if the packaging solder is used again, e.g., for assembly or mounting of the sensor device. For example, the reflow temperature may be reached when attaching solder balls to the sensor device, and yet again, when remelting the solder balls to attach the sensor device to a printed circuit board.

The disclosed embodiments provide an alternative solution to identifying and using a bond material with a lower bonding temperature for each successive bonding step. For example, it may be difficult to identify a process-compatible and otherwise suitable solder with a melting point between that of a first bond material (e.g., AlGe) used to bond the first two wafers and of Pb-free or other solders used for assembly. Using the technique of the disclosed embodiments, bonding the third wafer to the wafer pair (i.e., the wafers bonded by the first bond material) may thus be achieved without risk of parts shifting at a later point in fabrication or assembly.

The disclosed embodiments utilize trench cuts into the wafer stack or assembly to allow an adhesive or epoxy material, such as an underfill material, to further secure the attachment of two wafers bonded to one another by a bond material that may subsequently melt during fabrication or assembly. For example, the situation may be presented by a second cap wafer being bonded to a wafer pair of previously bonded wafers. The underfill or other epoxy or adhesive material is dispensed or provided through openings in the second cap wafer formed by the trench cuts. The underfill material may then wick between the second cap wafer and the wafer to which it is attached, thereby maintaining the structural integrity of the wafer stack during the remainder of the fabrication and assembly process. A third wafer may thus be sequentially bonded to a previously bonded wafer pair using a standard package assembly solder. The bond between the third wafer and the wafer pair remains intact when and even if the final package is bonded to a customer board using the same solder or another solder with a similar melting point.

The trench cuts may be configured to make controlled depth grooves into the wafer stack (e.g., wafer triplet or more). The controlled depth grooves may be deep enough to expose the standard or other solder used for attaching the third wafer. Underfill material is then dispensed into these grooves. The underfill material will keep the third wafer from moving during final assembly, even if the solder attaching it to the second silicon melts.

Although described below in connection with several MEMS sensor device examples, the disclosed embodiments may be useful in connection with various types of sensors. For example, the sensors of the disclosed embodiments may include sensors other than accelerometers or other sensors directed to detecting linear acceleration. The sensors also may include sensors other than gyroscopes or other sensors directed to detecting rotation, e.g., rotational orientation or acceleration. Additional or alternative devices may be integrated into the sensors of the disclosed embodiments. For example, pressure sensors and/or magnetic field sensors may be included. The disclosed embodiments are also not limited to MEMS devices. The number of sensors or sensor types may also vary. For instance, sensors of each type may be provided for detection along or in connection with a desired number of axes.

The disclosed embodiments are compatible with various packaging technologies and processes. For example, the sensor devices may be deployed in chip-scale packaging arrangements. The sensor devices may be subsequently attached to a circuit board using various solders, such as tin-lead (SnPb) eutectic solder and Pb-free solders. The sensors of the disclosed embodiments may be overmolded and deployed in accordance with surface mount technologies, such as quad flat no leads (QFN) packaging and land grid array (LGA) packaging. The sensors may be mounted in other types of packages. For example, the sensors may be packaged as a small outline integrated circuit (SOIC).

Regardless of the packaging technology, the sequential wafer bonding of the disclosed embodiments may be used to fabricate smaller sensor devices. The disclosed sensor devices may integrate multiple types of sensors in a single package. The footprint of the sensor devices may thus be smaller than, for instance, non-integrated sensor devices. For example, the footprint of the packaged sensor device may be about 3 millimeter (mm) by about 3 mm for sensors configured to sense three axes of linear acceleration and three axes of rotation. The footprint may have larger and/or smaller dimensions, as well. The thickness of the sensor devices may also be minimal despite the wafer stacking of the disclosed embodiments. In some examples, the thickness of the packaged sensor device may be about 0.6 mm or less. The thickness may be larger, as well. Such thicknesses may be achieved whether solder bumps are added for chip-scale packaging or whether the sensor device is overmolded.

FIG. 1 is a cross-sectional view of a sensor device 20 that includes a set of substrates attached in a stacked arrangement. The stacked substrate arrangement may be formed by dicing wafers attached using the sequential wafer bonding techniques described herein. The cross-sectional view may be taken along lines 1-1 of FIG. 2. The arrangement may include fewer, additional, or alternative substrates. For example, the arrangement need not include a fourth substrate for one or more magnetic sensing devices.

In this embodiment, the sensor device 20 includes a sensor substrate 22, a first cap substrate 24 attached to the sensor substrate 22 with a first bond material 26. The first bond material is arranged to define a first device cavity 28. The sensor device 20 further includes a second cap substrate 30 attached to the sensor substrate 22 with a second bond material 32. The second bond material 32 is arranged to define a second device cavity 34. The second bond material 32 has a lower bonding temperature than the first bond material 26. The lower bonding temperature of the second bond material 32 allows the second cap substrate 30 to be attached to the sensor substrate 22 without affecting the bond between the first cap substrate 24 and the sensor substrate 22.

The second cap substrate 30 is further secured to the sensor substrate 22 by an adhesive material 36. The adhesive material 36 is disposed between the sensor substrate 22 and the second cap substrate 30. In this example, the adhesive material 36 is not limited to a perimeter of the second cap substrate 30. The adhesive material 36 may be or include underfill epoxy and/or other material configured to wick between the sensor substrate 22 and the second cap substrate 30 to reach an interior region of the space between the substrates 22, 30. Examples of suitable underfill materials include the AbleStik UF8806G and AbleStik UF8822 adhesives available from Henkel AG. Other underfill epoxy or adhesive materials may be used.

The adhesive material 36 maintains the integrity of the attachment of the second cap substrate 30 to the sensor substrate 22 during any subsequent fabrication process or assembly steps in which the temperature reaches the reflow or bonding temperature of the second bond material 32. The adhesive material 36 is dispensed or provided through openings made by trench cuts through a wafer from which the second cap substrate 30 is diced. Further details regarding the trench cuts are provided in connection with several exemplary embodiments described below.

The sensor substrate 22 has a vent hole 38 in communication with the second cavity 34. The vent hole 38 provides a vent path through the sensor substrate 22 to transfer a pressure level on the other side of the sensor substrate 22 to the second cavity 34. The vent path may be established during fabrication before or after the first cap substrate 24 is attached to the sensor substrate 22. Without the vent path, the second cavity 34 would have the same pressure level as the first cavity 28. The vent path exposes the second cavity 34 to the pressure on the other side of the sensor substrate 22 as the second cap substrate 30 is attached. With the vent hole 38, the space enclosed in the second cavity 34 is present on both sides of the sensor substrate 22. The pressure level of the second cavity 34 may thus be at a level, e.g., an atmospheric pressure level, desirable for the sensors, e.g., accelerometers, in or exposed to the second cavity 34.

The attachment of the second cap substrate 30 further defines the second cavity 34 through a seal ring 40 of the second bond material 32. The seal ring 40 may surround the vent hole 38 in different arrangements. The seal ring 40 is disposed between the adhesive material 36 and the vent hole 38. In this example, the seal ring 40 is configured as a ring disposed adjacent a perimeter of the vent hole 38. In other embodiments, the seal ring 40 is spaced from the vent hole 38. For example, the seal ring 40 may be disposed in a ring that runs along a perimeter of the second cap substrate 30. Further details are provided below in connection with the embodiment described and shown in connection with FIG. 3.

The vent hole 38 allows the gas in the second cavity 34 to be at at a pressure higher than the pressure of the first cavity 28. The pressure of the first cavity 28 may be lower than the pressure in the second cavity 34, such as a near vacuum level, to support the operation of one or more sensors, such as MEMS sensors, disposed on an inverted or flipped side 43 of the sensor substrate 22 adjacent the first cap substrate 24. In this example, the sensor device 20 includes three gyroscopes 44 configured for sensing along three axes (e.g., three orthogonal axes). A near vacuum pressure level in the first cavity 28 may be useful for efficiently driving the gyroscopes 44 during operation. The first cap substrate 24 is attached in a fabrication environment at the near vacuum pressure or other desired level.

One or more sensors (e.g., MEMS sensors) of a different type may be located in or exposed to the second cavity 34. The sensors may be well suited for operation at a pressure level other than the pressure level in the first cavity 28 (e.g., the near vacuum pressure level) for the gyroscopes 44. In this example, the sensor device 20 includes three MEMS accelerometers 46 disposed in the second cavity 38 on the inverted side 42 of the sensor substrate 22. The higher pressure level of the second cavity 38 may be useful for damping the accelerometers 46 during operation.

In the embodiment of FIG. 1, ASICs or other integrated circuits are formed on and in the first cap substrate 24. In this example, the ASIC may be disposed along an inward side 48 of the first cap substrate 24. The inward side 48 faces or is disposed adjacent the inverted side 42 of the sensor substrate 22. The first cap substrate 24 may include through substrate (e.g., silicon) vias (TSVs) 50 to carry signals to and from an outward side 52 of the cap substrate 24 to an inward side of the cap substrate 24. One or more distribution circuits may be disposed on the outward side 52 to couple the TSVs 50 to assembly solder bumps 54.

In other embodiments, one or more ASICs are formed on and in the second cap substrate 30. Such ASICs may be in addition or alternative to any circuitry on the first cap substrate 24.

The sensor device 20 has a number of artifacts of the sequential wafer bonding technique of the method by which the sensor device 20 was fabricated. A periphery 56 of the second cap substrate 30 is indicative of the trench cuts made to provide the adhesive material 36. As described below, the trench cuts may be made along die scribe lines. As a result, the periphery 56 may be inwardly offset from a periphery 58 of the sensor substrate 22 and a periphery 60 of the first cap substrate 24.

The sensor device 20 may include further artifacts of the sequential wafer bonding. One such artifact involves the adhesive material 36. The adhesive material 36 may be disposed along the periphery 56, or outer edges, of the second cap substrate 30. Another artifact involves the periphery 58 of the sensor substrate 22. In this example, the sensor substrate 22 has an indent 62 along an edge adjacent the second cap substrate 30. The indent 62 may be formed during the trench cut, and may thus match a lateral extent of the periphery 56 of the second cap substrate 30. In other cases, the trench cut does not result in the formation of the indent 62. However, even when there is no intention to form the indent 62, the indent 62 may nonetheless be formed because it may be difficult to precisely control the depth of the trench cut. Even if the trench cut may be configured as a controlled depth saw or etch cut, the indent 62 may nonetheless be formed to ensure that the openings pass all the way through the second cap substrate 30 over the entire width thereof.

Another die may be wire bonded to the outward side of the first cap substrate 24. In this example, a magnetic sensor die 64 is bonded to the outward side. The die may be bonded in other manners, such as surface mounted, or ball or bump mounted.

Figure 2:
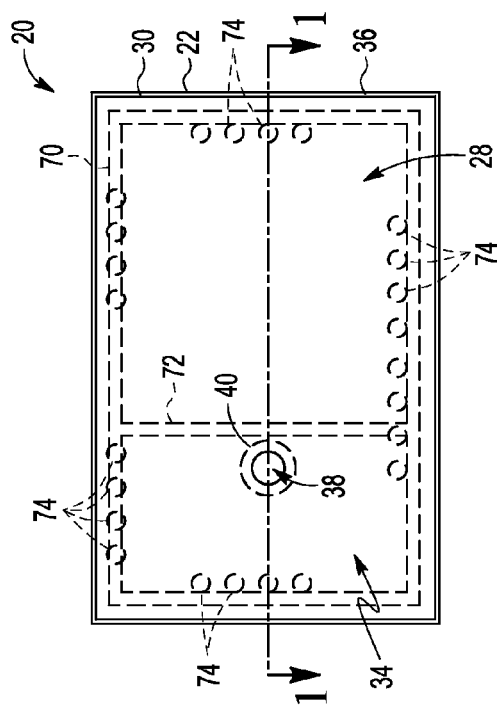
FIG. 2 is a schematic, simplified, plan view of the sensor device of FIG. 1.

FIG. 2 is a plan view of the sensor device 20 to depict the arrangements of the first and second bond materials 26, 32 (FIG. 1) in greater detail. In this example, the bond material arrangement follows the rectangular periphery of the die stack of the sensor device 20. The periphery of the sensor substrate 22 is positioned laterally outward of the periphery of the second cap substrate 30, which is disposed below the adhesive material 36 as a result of the trench cuts through the second cap substrate 30.

The first bond material 26 is arranged in a sealing ring 70 along the periphery of the die stack. The first bond material 26 is further arranged to form a cavity partition line 72 that, together with the sealing ring 70, defines the first cavity 28 and the second cavity 34. The first bond material 26 may be arranged in any number of additional structures (not shown) within the first and second cavities 28, 34. For example, the first bond material 26 may be arranged in a number of signal bumps to carry signals from the sensors 44, 46 (FIG. 1) to the ASIC on the first cap substrate 24 (FIG. 1). The sealing ring 70 and the cavity partition line 72 may have a wide variety of other arrangements. For instance, the sealing ring 70 may be spaced from a periphery of the sensor substrate 22 as shown, rather than disposed along, or solely along, the periphery as shown.

In this embodiment, the second bond material 32 is arranged in a number of structural (or non-signal) solder bumps 74 disposed along a periphery of the second cap substrate 30, which is inset or offset from the periphery of the sensor substrate 22 as shown. With the trench cuts positioned along die scribe lines, the structural solder bumps 74 may be disposed inward of the trench cuts along the periphery of the sensor substrate 22 as shown. Alternatively or additionally, any number of structural solder bumps may be disposed within an interior of the space between the sensor substrate 22 and the second cap substrate 30. In alternative embodiments in which one or more trench cuts are made in areas other than the die scribe lines, the structural solder bumps 74 may be disposed outside of the trench cuts.

The second bond material 32 is also arranged as the sealing ring 40 adjacent the vent hole 38 to further define the second cavity 34. The second bond material 32 may also include other arrangements in addition to the solder bumps 74 and the sealing ring 40. For example, in alternative embodiments in which an ASIC or other circuit is disposed on the second cap substrate 30, the second bond material 32 may be arranged in a number of signal carrying bumps. The sealing ring 40 need not be aligned with, or overlap, the partition line 72, as may be implied by the cross-sectional view of FIG. 1. The position of the sealing ring 40 within the cavity 34 relative to the partition line 72 may thus vary.

In the example of FIG. 2, the trench cuts are made along die scribe lines in both lateral directions. As a result, the peripheral offsets of the sensor substrate 22 and the second cap substrate 30 are present along each edge of the sensor device 20. In other cases, the trench cuts may be made along a subset of the die scribe lines. For example, the trench cuts may be made along the die scribe lines in only a single direction, or along only some of the die scribe lines in one or both of the directions. In other embodiments, the trench cuts may be made at locations other than or in addition to the die scribe lines.

Figure 3:
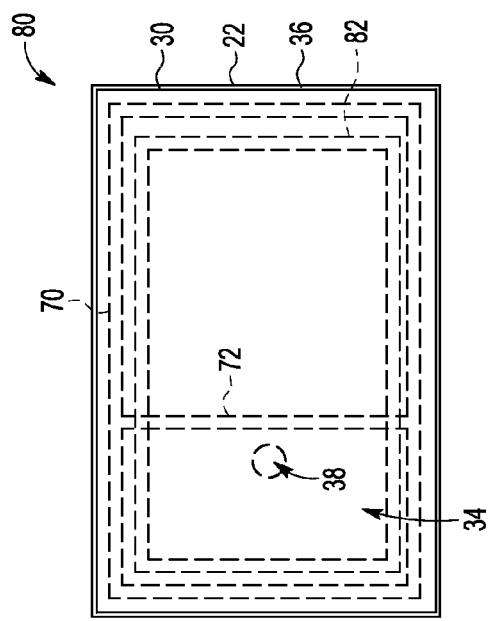
FIG. 3 is a schematic, simplified, plan view of another sensor device having multiple sensor cavities in accordance with one embodiment.

FIG. 3 is a plan view of a sensor device 80 having an alternative bond material arrangement for the second bond material, i.e., the bond material that attaches the second cap substrate 30 to the sensor substrate 22. The sensor device 80 may be otherwise configured similarly to the above-described embodiments. For instance, the sensor device 80 may have a stacked substrate arrangement with a pair of cap substrates attached on opposite sides of the sensor substrate 22, with the second cap substrate 30 inset or inwardly offset as shown in FIG. 2 due to trench cuts. In this embodiment, the second cap substrate 30 is attached the sensor substrate 22 via second bond material arranged in a seal ring 82.

The seal ring 82 is disposed along a periphery of the second cap substrate 30. Like the seal ring 40 of the embodiment of FIG. 2, the seal ring 82 defines the second cavity 34 and provides a barrier for the adhesive material 36. The seal ring 82 may also provide a barrier for contaminants or artifacts of the process of making the trench cuts. For example, the adhesive material 36 may carry saw slurry into the space between the second cap substrate 30 and the sensor substrate 22, as described below. Placement of the barrier along the periphery of the second cap substrate 30 rather than adjacent the vent hole 38 may be useful if, for instance, the second cap substrate 30 has a circuit. The second cavity 34 is also defined by the sealing ring 70 and the cavity partition line 72 as described above.

Figure 4:
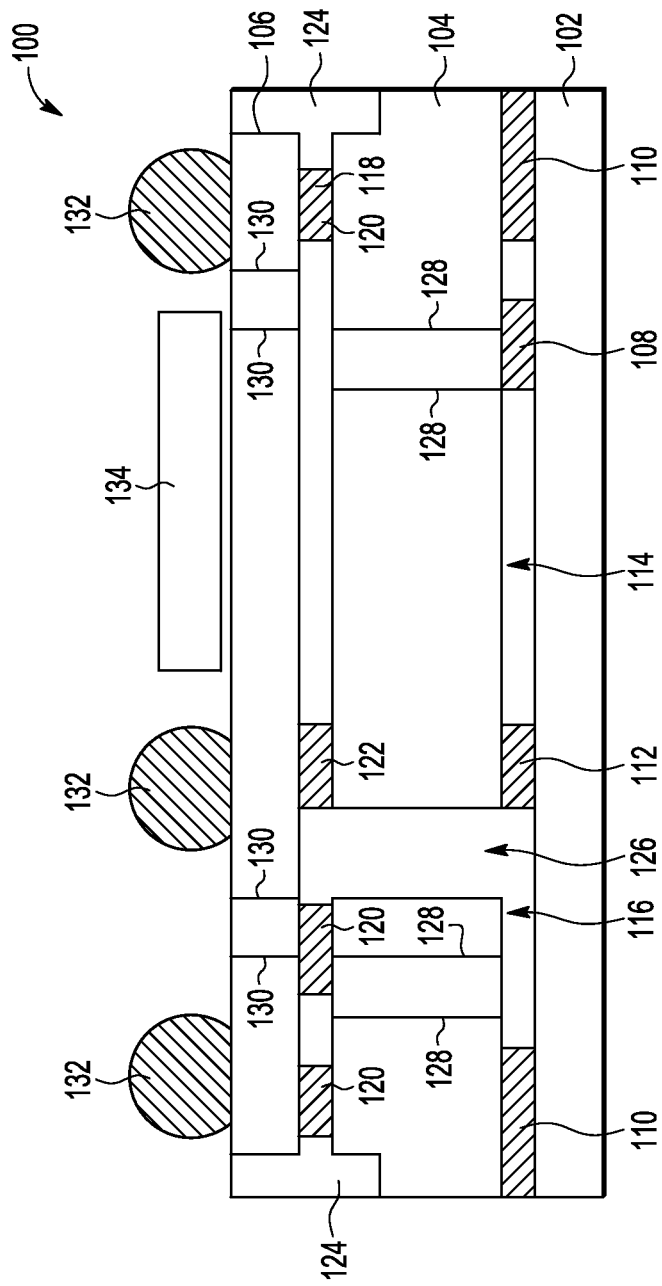
FIG. 4 is a schematic, simplified, cross-sectional view of yet another sensor device having multiple sensor cavities in accordance with one embodiment.

FIG. 4 depicts a sensor device 100 having a first cap substrate 102, a sensor substrate 104, and a second cap substrate 106, that may be attached to one another as described above. In this embodiment, the ASIC or other circuitry is disposed on the second cap substrate 106 rather than the first cap substrate 102. First bond material 108 between the first cap substrate 102 and the sensor substrate 104 may be arranged in a seal ring 110 with a cavity partition line 112 to define a first sensor cavity 114 and a second sensor cavity 116. Second bond material 118 having a different melting temperature from the first bond material 108 and positioned between the sensor substrate 104 and the second cap substrate 106 may be arranged in an outer set of bumps 120 and an inner seal ring 122. The outer set of bumps 120 may include both signal and structural bumps. The inner seal ring 122 provides a barrier for adhesive material 124 used to further secure the second cap and sensor substrates 104, 106, as described above. The inner seal ring 122 may be positioned adjacent a vent hole 126 through the sensor substrate 104 to further define the second cavity 116. The inner seal ring 122 separates the sensor devices (e.g., MEMS accelerometer(s)) in the second sensor cavity 114 from the circuitry (e.g., an ASIC) disposed in and/or on the second cap substrate 106.

The sensor substrate 104 has a number of TSVs 128 to carry signals between the circuitry and the sensors in the sensor device cavities 114, 116. The second bond material 118 may be arranged in any number of signal bumps to couple the circuitry to the TSVs 128. The signal bumps may be distributed across the die as desired. The sensor substrate 104 and/or the second cap substrate 106 may include redistribution circuitry to establish the locations of the signal bumps. In this example, further TSVs 130 are formed in the second cap substrate 106 to carry signals to an outer side of the second cap substrate 106 on which further redistribution circuitry and solder bumps 132 are formed. A further sensor substrate 134 may also be wire bonded to the outer side as shown. Surface mount and other techniques may be used. In some cases, the further sensor substrate 134 includes one or more magnetic sensor devices.

The embodiment of FIG. 4 may be useful because the ASIC or other circuitry of the sensor device 100 need not be exposed to temperatures higher than the reflow temperature of the second bond material 118. In contrast, in the embodiment of FIG. 1, the circuitry is exposed to the higher bonding temperature of the first bond material during the attachment of the first cap wafer. In some cases, the ASIC may be sensitive to such temperatures, such as embodiments having a sensor, e.g., a magnetic sensor, integrated therein.

In an alternative embodiment, both of the first and second cap substrates 102, 106 include ASICs or other circuitry coupled to the sensors.

The first bond material in the embodiments described above may be or include an alloy of aluminum-germanium (Al—Ge). The Al—Ge alloy attaches the first cap substrate and the sensor substrate via a eutectic bond that forms at a high bonding temperature not reached in subsequent bonding or assembly processes. The Al—Ge may thus constitute the top of a solder hierarchy for the sensor devices of the disclosed embodiments. For example, the bonding temperature of the first bond material may be about 400° C., although it may be higher or lower, as well. Other present or future developed alloys having such high bonding temperatures may be used as the first bond material.

The second bond material in the embodiments described above has a bonding temperature lower than the high bonding temperature of the first bond material. The second bond material may be or include a tin-based solder. For example, the second bond material may be a tin-silver alloy, such as a tin-silver-copper (SnAgCu) alloy. The bonding temperature of the first bond material may thus be about 230-250° C., although it may be higher or lower, as well. Other tin-based or tin-silver solders may be used, such as tin-antimony (SnSb), high lead (Pb) solders (e.g., PbSn and PbSnAg). Other present or future developed solders may be used as the second bond material.

The above-described substrates may include a semiconductor substrate. A variety of semiconductor materials may be used, including elementary semiconductors, such as silicon (Si), and compound semiconductors, such as gallium arsenide (GaAs) and gallium nitride (GaN). Other compound and non-compound semiconductor materials may be used. The substrate may be a bulk semiconductor wafer. Other types of semiconductor substrates may be used. For example, one or more of the substrates may be configured as a semiconductor-on-insulator (SOI) substrate. In some cases, the substrate is a composite substrate with any number of layers (e.g., a base layer and one or more epitaxial layers). For example, the substrate may include an original p-type semiconductor substrate on which the insulator, epitaxial, or other layers are grown or otherwise formed. Alternatively or additionally, the substrate may include non-semiconductor materials. The above-described substrates need not be configured similarly. For example, one of the cap substrates may be a glass or other dielectric substrate, while the other cap substrate and the sensor substrate are semiconductor substrates (e.g., silicon substrates or compound substrates).

Figure 5:
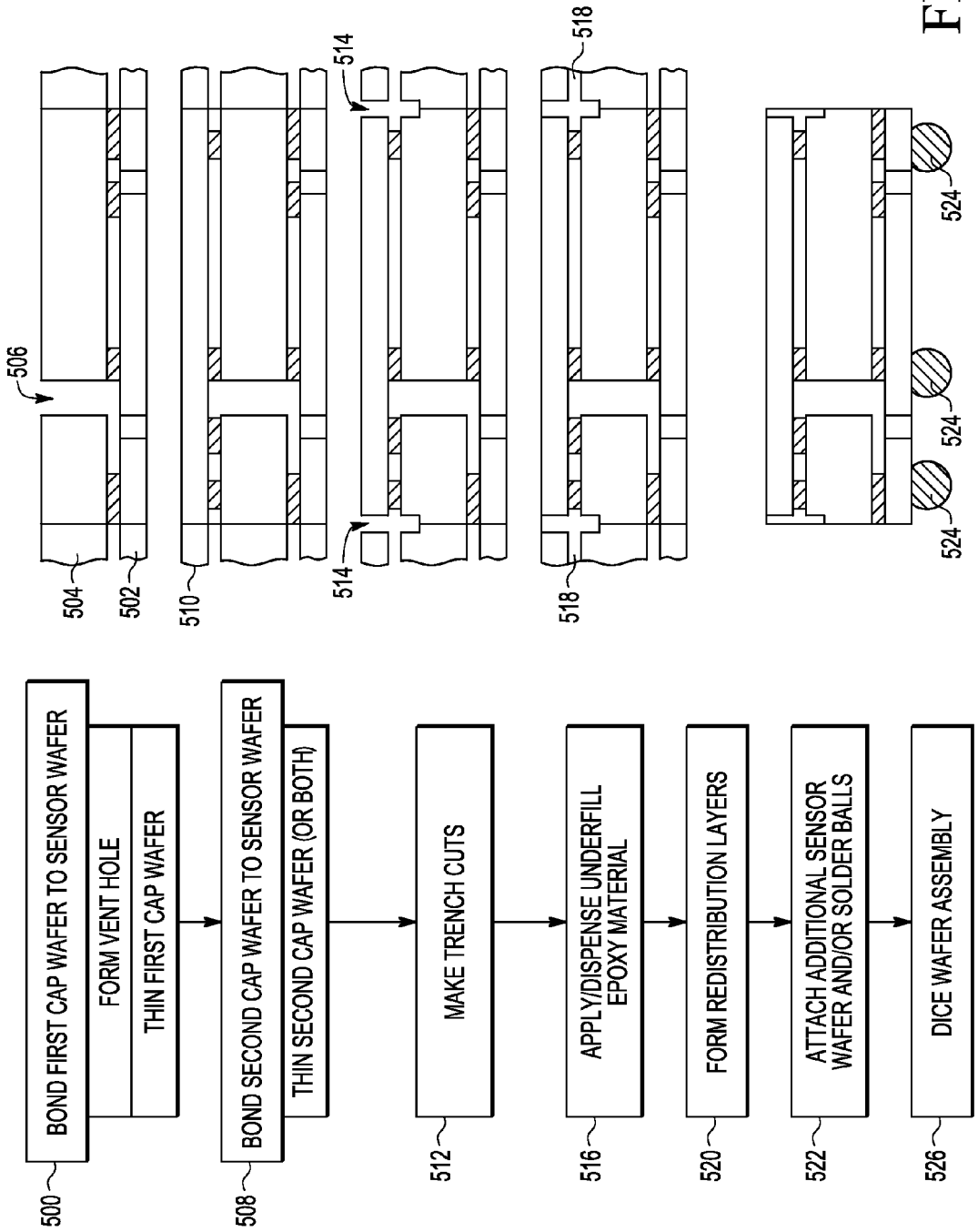
FIG. 5 is a flow diagram of an exemplary method of fabricating a sensor device in which wafers are sequentially bonded in accordance with one embodiment.

FIG. 5 depicts a method of fabricating a sensor device, such as the sensor devices described above. The fabrication method includes sequential wafer bonding processes configured to prevent cap wafer shifts or slippage during subsequent high temperature processes, such as solder ball attachment and final assembly. The method includes a sequence of acts or steps, only the salient of which are depicted for convenience in illustration. Additional, fewer, or alternative acts or steps may be implemented. For example, additional bonding acts or steps may be implemented, including, for instance, acts directed to attaching a magnetic sensor chip to incorporate further sensor technologies into the sensor device.

The method may begin with, or include, a number of acts in which device structures are formed in sensor and cap substrates. The device structures may be configured to define a number of transistor or other devices in circuitry (e.g., an ASIC) formed in and/or on a substrate of a cap wafer. In some cases, the circuitry is formed in the substrates of multiple cap wafers. Other device structures may be configured as sensors formed in and/or supported by a substrate of a sensor wafer. For example, each die on the sensor wafer may include one or more MEMS accelerometers, one or more MEMS gyroscopes, and/or one or more other types of sensors or other devices.

In an act 500, a first cap wafer 502 is bonded or attached to a sensor wafer 504 with a first bond material. The first bond material may include an Al-Ge alloy or other material having a high or other bonding temperature not subsequently reached during fabrication or assembly, as described above. The sensor wafer 504 includes a plurality of die, one of which is demarcated by die scribe lines for ease in illustration in the cutaway views depicted in FIG. 5. The first bond material is arranged to define a first device cavity for each die of the plurality of die. For example, the first bond material may be arranged in a seal ring having a cavity partition line as described above. The act 500 may be implemented at a pressure such that the sensor disposed in the first cavity operates at a suitable pressure level, such as a near vacuum pressure level.

In some embodiments, a vent hole 506 is formed in each die of the sensor wafer 504 to allow a different pressure level to be established in a second cavity of the sensor device. Alternatively, the vent hole 506 is formed before the attachment of the first cap wafer 502. The first cap wafer 502 may be thinned during, for example, a backgrinding process, after the attachment. In some cases, the first cap wafer 502 is only partially thinned at this point, or not thinned until a subsequent point, if, for instance, a thicker wafer may be useful for handling.

In an act 508, a second cap wafer 510 is bonded or attached to the sensor wafer with a second bond material. The second bond material has a lower bonding temperature than the first bond material, as described above. For example, the second bond material may be a Pb-free solder, such as a tin-silver-based solder, or the second bond material may be another material. The second bond material is arranged to define a second device cavity for one or more sensors (e.g., accelerometers) on each die of the plurality of die. The arrangement may surround the vent hole in various ways. In some embodiments, the second bond material is arranged in a seal ring disposed adjacent the vent hole. In other embodiments, the seal ring of the second bond material is disposed along a periphery of the second cap substrate. Either way, the second bond material is disposed between the vent hole and the adhesive material used to secure the second cap wafer and the sensor wafer.

The act 508 may include thinning the second cap wafer. A backgrinding process may be implemented. The first cap wafer may be thinned at this point as well.

After the second cap wafer is attached, trench cuts through the second cap wafer are implemented in an act 512 to form openings 514 in the second cap wafer. The openings may extend along the lateral width of the wafer stack and, thus, be slot-shaped when viewed from above. The trench cuts may be made along die scribe lines of the wafer stack or otherwise outside of the sealing ring of the second bond material, as shown. In some embodiments, the trench cuts are made in both (e.g., orthogonal) die scribe line directions. In other cases, the trench cuts are made along only one of the die scribe line directions. The trench cuts may be made to a depth that passes through the entire second cap wafer, thereby exposing the second bond material. The depth of the trench cuts may vary across the width of the wafer stack.

In some cases, or in some areas, the trench cuts are deeper than necessary to define an opening through the second cap wafer. For example, it may be difficult to control the trench cut to make a uniform cut across the entire width of the second cap wafer. Implementing the trench cuts may thus form grooves in the sensor wafer 504. Providing the underfill material may then fill the grooves in the sensor wafer with the underfill material. As shown in FIG. 5, the openings 514 may include an indent along an edge of the sensor die. The indent may provide additional surface area for the adhesive material. The trench cuts may be implemented by sawing through the second cap wafer and/or through an etch process, such as a deep reactive ion etch (DRIE) process.

In an act 516, underfill material 518 is dispensed or otherwise provided through the openings to further secure the second cap wafer to the sensor wafer. The underfill material 518 may be or include an underfill epoxy material and/or other adhesive material. The underfill material 518 is configured to wick into the space between the second cap wafer 510 and the sensor wafer 504. In the example of FIG. 5, the underfill material does not travel much beyond the perimeter of the second cap wafer die as a result of the peripheral positioning of the seal ring. The opening and the underfill material may thus be disposed along the die perimeter of the sensor wafer.

The method may then include the formation of one or more redistribution layers in an act 520. In this example, the redistribution layers are disposed along the outer side of the first cap wafer. The redistribution layers may include any number of metallization and passivation layers to establish locations for a number of solder balls 524 to be attached in an act 522. The solder balls may have a bonding or reflow temperature no lower than the second bonding temperature used to attach the second cap wafer. In some cases, the solder balls are or include the same bond material used for attaching the second cap substrate.

Alternatively or additionally, another sensor die is attached along the outer side of the first cap wafer. The additional sensor die may be wire bonded or otherwise attached to the first cap wafer. The sensor die may be configured as a magnetic sensor, for example. The magnetic sensor may sense along three orthogonal axes, which, when combined with three orthogonal axes of linear sensing and three orthogonal axes of rotational sensing, may provide a sensor device with a total of nine degrees of freedom.

The wafer stack may then be diced along the die scribe lines in an act 526. The dicing of the wafer stack may leave the underfill material disposed along edges of the die as shown in FIG. 5.

The order of the acts described above may vary. For example, the magnetic sensor die may be attached to the wafer stack after the act 526.

The disclosed embodiments described above support a wafer-level technique for combining different types of sensors, e.g., MEMS sensors, such as gyroscopes and accelerometers, into a single combination die in a side-by-side arrangement. The disclosed embodiments establish respective cavities for the different sensor types to achieve a dual pressure combination die. The cavities provide respective pressure levels for the different sensor types. The combination die provides such dual pressure functionality in a smaller footprint and smaller thickness.

The different pressures are provided through the sequential attachment of two cap wafers in a manner that prevents subsequent shifting of the cap wafers. Shifts are avoided even though a bond material is used for attachment of a third wafer (i.e., the second cap wafer) to a previously bonded wafer pair that may remelt or reflow at a later point in fabrication or assembly. A standard package assembly solder, such as SnAgCu or some other material, may thus be used as the bond material for the second cap wafer. The solder bond between the second cap wafer and a sensor wafer remains intact when the sensor device (e.g., the packaged sensor device) is assembled, e.g., bonded to a printed circuit board. The attachment of the second cap wafer is secured with underfill or other adhesive material provided through controlled depth grooves or trenches cut into or otherwise formed in the wafer stack as described above.

In one aspect, a method of fabricating a sensor device includes attaching a first wafer to a sensor wafer with a first bond material, and attaching a second wafer to the sensor wafer with a second bond material, the second bond material having a lower bonding temperature than the first bond material. After attaching the second wafer, the method further includes forming an opening through the second wafer, and providing an adhesive material through the opening to further secure the second wafer to the sensor wafer.

In a second aspect, a method of fabricating a sensor device includes attaching a first cap wafer to a sensor wafer with a first bond material, the sensor wafer including a plurality of die, the first bond material being arranged to define a first device cavity for each die of the plurality of die, and attaching a second cap wafer to the sensor wafer with a second bond material, the second bond material being arranged to define a second device cavity for each die of the plurality of die, the second bond material having a lower bonding temperature than the first bond material. After attaching the second cap wafer, the method further includes forming one or more openings through the second cap wafer along die scribe lines, and providing an underfill material through the one or more openings to further secure the second cap wafer to the sensor wafer.

In a third aspect, a sensor device includes a sensor substrate, a first cap substrate attached to the sensor substrate with a first bond material, the first bond material being arranged to define a first device cavity, and a second cap substrate attached to the sensor substrate with a second bond material, the second bond material being arranged to define a second device cavity, the second bond material having a lower bonding temperature than the first bond material. The second cap substrate is further secured to the sensor substrate by an adhesive material disposed between the sensor substrate and the second cap substrate.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method of fabricating a sensor device, the method comprising:
   attaching a first wafer to a sensor wafer with a first bond material;
   attaching a second wafer to the sensor wafer with a second bond material, the second bond material having a lower bonding temperature than the first bond material;
   after attaching the second wafer, forming an opening through the second wafer; and
   providing an adhesive material through the opening to further secure the second wafer to the sensor wafer.

2. The method of claim 1, wherein the first bond material comprises an aluminum-germanium (AlGe) alloy.

3. The method of claim 1, wherein the second bond material is selected from the group consisting of a tin-silver-copper (SnAgCu) alloy, a tin-antimony (SnSb) alloy, a lead-tin (PbSn) alloy, and a lead-tin-silver (PbSnAg) alloy.

4. The method of claim 3, wherein:
   the second bond material is arranged as a sealing ring disposed along a die perimeter on the sensor wafer; and
   the opening is disposed outside of the sealing ring.

5. The method of claim 1, wherein:
   forming the opening comprises implementing a trench cut through the second wafer, which forms a groove in the sensor wafer; and
   providing the adhesive material fills the groove in the sensor wafer with the adhesive material.

6. The method of claim 5, wherein the trench cut is positioned along a die scribe line.

7. The method of claim 1, further comprising attaching solder balls to the first wafer or the second wafer, the solder balls having a bonding temperature no lower than the bonding temperature of the second bond material.

8. The method of claim 1, further comprising attaching solder balls to the first wafer or the second wafer, the solder balls comprising the second bond material.

9. The method of claim 1, wherein:
   attaching the first wafer is implemented at a first pressure to define a first device cavity at the first pressure for a die on the sensor wafer; and
   attaching the second wafer is implemented at a second pressure higher than the first pressure to define a second device cavity at the second pressure for the die.

10. The method of claim 9, further comprising, before attaching the second wafer, forming a vent hole through the sensor wafer, wherein the second bond material is arranged in a seal ring disposed between the adhesive material and the vent hole.

11. The method of claim 1, wherein the adhesive material comprises an underfill epoxy material.

12. A method of fabricating a sensor device, the method comprising:
   attaching a first cap wafer to a sensor wafer with a first bond material, the sensor wafer comprising a plurality of die, the first bond material being arranged to define a first device cavity for each die of the plurality of die;
   attaching a second cap wafer to the sensor wafer with a second bond material, the second bond material being arranged to define a second device cavity for each die of the plurality of die, the second bond material having a lower bonding temperature than the first bond material;
   after attaching the second cap wafer, forming one or more openings through the second cap wafer along die scribe lines; and
   providing an underfill material through the one or more openings to further secure the second cap wafer to the sensor wafer.

13. The method of claim 12, wherein the first bond material comprises an aluminum-germanium (AlGe) alloy, and wherein the second bond material is selected from the group consisting of a tin-silver-copper (SnAgCu) alloy, a tin-antimony (SnSb) alloy, a lead-tin (PbSn) alloy, and a lead-tin-silver (PbSnAg) alloy.

14. The method of claim 12, wherein:
   the second bond material is arranged in a respective sealing ring disposed along a perimeter of each die; and
   each opening formed by one of the trench cuts is disposed outside of the respective sealing ring.

15. The method of claim 12, wherein:
   forming the one or more openings comprises implementing one or more trench cuts, which forms one or more grooves in the sensor wafer; and
   providing the underfill material fills the one or more grooves in the sensor wafer with the underfill material.

* * * * *